(12) United States Patent
Kim et al.

(10) Patent No.: US 6,545,491 B2
(45) Date of Patent: Apr. 8, 2003

(54) APPARATUS FOR DETECTING DEFECTS IN SEMICONDUCTOR DEVICES AND METHODS OF USING THE SAME

(75) Inventors: Yang-hyong Kim, Seoul (KR); Hyo-cheon Kang, Kyungki-do (KR); Deok-yong Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/940,943

(22) Filed: Aug. 28, 2001

(65) Prior Publication Data

US 2002/0043628 A1 Apr. 18, 2002

Related U.S. Application Data

(63) Continuation-in-part of application No. 09/384,885, filed on Aug. 27, 1999.

(30) Foreign Application Priority Data

Nov. 23, 2000 (KR) ............................................. 00-70009

(51) Int. Cl.[7] ............................................. G01R 31/305
(52) U.S. Cl. ........................ 324/751; 324/765; 250/310
(58) Field of Search ................................. 324/750–753, 324/765, 71.3, 158.1; 250/306, 307, 310–311, 441.11, 492.2, 397

(56) References Cited

U.S. PATENT DOCUMENTS

| | | | |
|---|---|---|---|
| 4,326,165 A | 4/1982 | Szedon | 324/765 |
| 4,985,681 A | 1/1991 | Brunner et al. | 324/501 |
| 5,023,453 A | 6/1991 | Adachi et al. | 250/309 |
| 5,057,689 A | 10/1991 | Nomura et al. | 250/310 |
| 5,302,828 A | 4/1994 | Monahan | 250/307 |
| 5,412,210 A * | 5/1995 | Todokoro et al. | 250/310 |
| 5,493,116 A | 2/1996 | Toro-Lira et al. | 250/310 |
| 5,578,821 A * | 11/1996 | Meisberger et al. | 250/310 |
| 5,773,989 A | 6/1998 | Edelman et al. | 324/765 |
| 5,825,035 A | 10/1998 | Mizumura et al. | 250/423 |
| 5,877,498 A | 3/1999 | Sugimoto et al. | 250/310 |
| 5,986,263 A | 11/1999 | Hiroi et al. | 250/310 |
| 6,067,153 A | 5/2000 | Mizuno | 356/237 |
| 6,344,750 B1 * | 2/2002 | Lo et al. | 324/751 |

FOREIGN PATENT DOCUMENTS

EP                0 504 944 A2         9/1992

* cited by examiner

*Primary Examiner*—Kamand Cuneo
*Assistant Examiner*—Minh N. Tang
(74) *Attorney, Agent, or Firm*—Myers Bigel Sibley & Sajovec (57) ABSTRACT

The present invention provides apparatus and methods for detecting defects in a semiconductor device. The semiconductor device includes a plurality of conductive pads, which may be formed, for example, between insulating layers for insulating the conductive pads from conductive lines formed between ones of the conductive pads. Electrons and/or holes are accumulated in ones of the conductive pads, for example, on the surface of the conductive pads. A contrast associated with one of the conductive pads is detected based on secondary electron emissions from the ones of the conductive pads after accumulation of the electrons and/or holes. The presence of defects is determined based on the detected contrast.

31 Claims, 7 Drawing Sheets

APPARATUS FOR DETECTING DEFECTS IN SEMICONDUCTOR DEVICES AND METHODS OF USING THE SAME

RELATED APPLICATION

This application claims priority from Korean Application No. 00-70009, filed Nov. 23, 2000, the disclosure of which is hereby incorporated herein by reference. This application is further a continuation-in-part of U.S. patent application Ser. No. 09/384,885, entitled "Methods of Inspecting Integrated Circuit Substrates Using Electron Beams" filed Aug. 27, 1999, the disclosure of which is hereby incorporated herein by reference.

FIELD OF THE INVENTION

The present invention relates to apparatus for detecting defects in a semiconductor device and, more particularly, to apparatus for detecting electrical defects in a semiconductor device and methods for using the same.

BACKGROUND OF THE INVENTION

During the manufacture of semiconductor devices, various defects can occur. These defects may cause malfunctions and failures in the semiconductor devices. The defects introduced during manufacture of the devices can generally be divided into two categories including physical defects, such as particles, which cause a physical abnormality on the surface of a semiconductor substrate and electrical defects which do not accompany physical defects but bring about electrical failure in a semiconductor device. Physical defects can generally be detected by conventional image observation equipment. However, electrical defects cannot typically be detected by ordinary surface detection equipments.

It is known to test contact holes extending to a doped region of a semiconductor between the spacers along the walls of the stacked structure of a formed gate electrode using an electron beam inspection apparatus. In-line monitoring of whether a contact hole formed in the semiconductor substrate is in an open or not-open state is performed using the electron beam inspection apparatus. If an unetched material layer (e.g., an oxide or nitride layer) is present in the contact hole, primary electrons may not flow properly to the silicon substrate so that electrons accumulate on the surface of the unetched material layer. Then, a large amount of secondary electrons may be emitted from the surface of the silicon substrate. Depending on a difference in secondary electron yields, a brighter (white) or darker (black) image may be displayed for a portion where a large amount of secondary electrons are emitted, that is, a portion where the unetched material layer is present, compared to portions where the unetched material layer is not present. However, such an approach may not reliably detect all unetched conditions and further is performed before material is deposited in the contact hole.

Accordingly, it would be desirable to provide improved methods and apparatus for the detection of electrical defects during the manufacture of semiconductor devices.

SUMMARY OF THE INVENTION

Methods and apparatus for detecting defects in a semiconductor device including a plurality of conductive pads are provided in accordance with various embodiments of the present invention. The methods include accumulating electrons in ones of the plurality of conductive pads and detecting a first contrast between the ones of the plurality of conductive pads based on secondary electron emissions from the ones of the plurality of conductive pads after electrons are accumulated in the ones of the plurality of conductive pads. Holes are accumulated in the ones of the plurality of conductive pads and a second contrast is detected between the ones of the plurality of conductive pads based on secondary electron emissions from the ones of the plurality of conductive pads after holes are accumulated in the ones of the plurality of conductive pads. It is determined whether a defect is present in one of the conductive pads based on the first contrast and the second contrast.

In other embodiments of the present invention, the detecting operations include applying a primary electron beam to the ones of the plurality of conductive pads. The accumulating electrons and holes may be accumulated at a surface of the ones of the plurality of conductive pads. Electrons may be accumulated by adjusting the energy of a primary electron beam applied to the ones of the plurality of contact pads to a first level and holes may be accumulated by adjusting the energy of a primary electron beam applied to the ones of the plurality of conductive pads to a second level. The electrons and/or holes may, alternatively, be accumulated using an ion generator.

In further embodiments of the present invention, a first voltage contrast associated with the one of the conductive pads is detected and a second voltage contrast associated with the one of the conductive pads are detected. Detecting operations may further include associating either a first bright image or a first dark image with the one of the conductive pads based on the detected first voltage contrast and associating either a second bright image or a second dark image with the one of the conductive pads based on the detected second voltage contrast. The voltage contrast may be determined based on a standard value. Alternatively, the voltage contrast may be determined based on a comparison of secondary electron emissions from the one of the conductive pads and secondary electron emissions from at least one other one of ones of the plurality of conductive pads.

In other embodiments of the present invention, determining whether defects are present may include determining that an electrical defect caused by a junction leakage source is present in the one of the conductive pads when the one of the conductive pads is associated with a first dark image and a second bright image. It may also be determined that an electrical defect caused by a non-etched contact portion between the one of the contact pads and a semiconductor substrate of the semiconductor device is present in the one of the conductive pads when the one of the conductive pads is associated with a first bright image and a second dark image. It may further be determined that an electrical defect caused by a short-circuit between the one of the conductive pads and an adjacent conductive line of the semiconductor device is present in the one of the conductive pads when the one of the conductive pads is associated with a first bright image and a second bright image. It may also be determined that a physical defect is present in the one of the conductive pads when the one of the conductive pads is associated with a first dark image and a second dark image.

In further embodiments of the present invention, the electrons are accumulated by generating a voltage difference between a surface of the semiconductor device and a backside of the semiconductor device selected to provide an accumulation of electrons in the ones of the conductive pads. The holes may be accumulated by generating a voltage difference between a surface of the semiconductor device and a backside of the semiconductor device selected to provide an accumulation of holes in the ones of the conductive pads. The voltage difference may be generated by adjusting the energy of a primary electron beam applied to the ones of the plurality of conductive pads.

In other embodiments of the present invention, apparatus are provided for detecting defects in a semiconductor device including a plurality of conductive pads. The apparatus include an electron beam source configured to apply a primary electron beam to the semiconductor device having a first state which causes accumulation of electrons in ones of the plurality of conductive pads, a second state which causes accumulation of holes in the ones of the conductive pads, and a third state that allows detection of secondary electron emissions from the ones of the plurality of conductive pads. The apparatus further include a data analyzer configured to detect a first contrast between the ones of the plurality of conductive pads based on secondary electron emissions from the ones of the plurality of conductive pads after electrons are accumulated in the ones of the plurality of conductive pads and to detect a second contrast between the ones of the plurality of conductive pads based on secondary electron emissions from the ones of the plurality of conductive pads after holes are accumulated in the ones of the plurality of conductive pads. The data analyzer is further configured to determine whether a defect is present in one of the conductive pads based on the first contrast and the second contrast. The apparatus may also include a stage control unit configured to detect positions on the semiconductor device of defects determined to be present.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
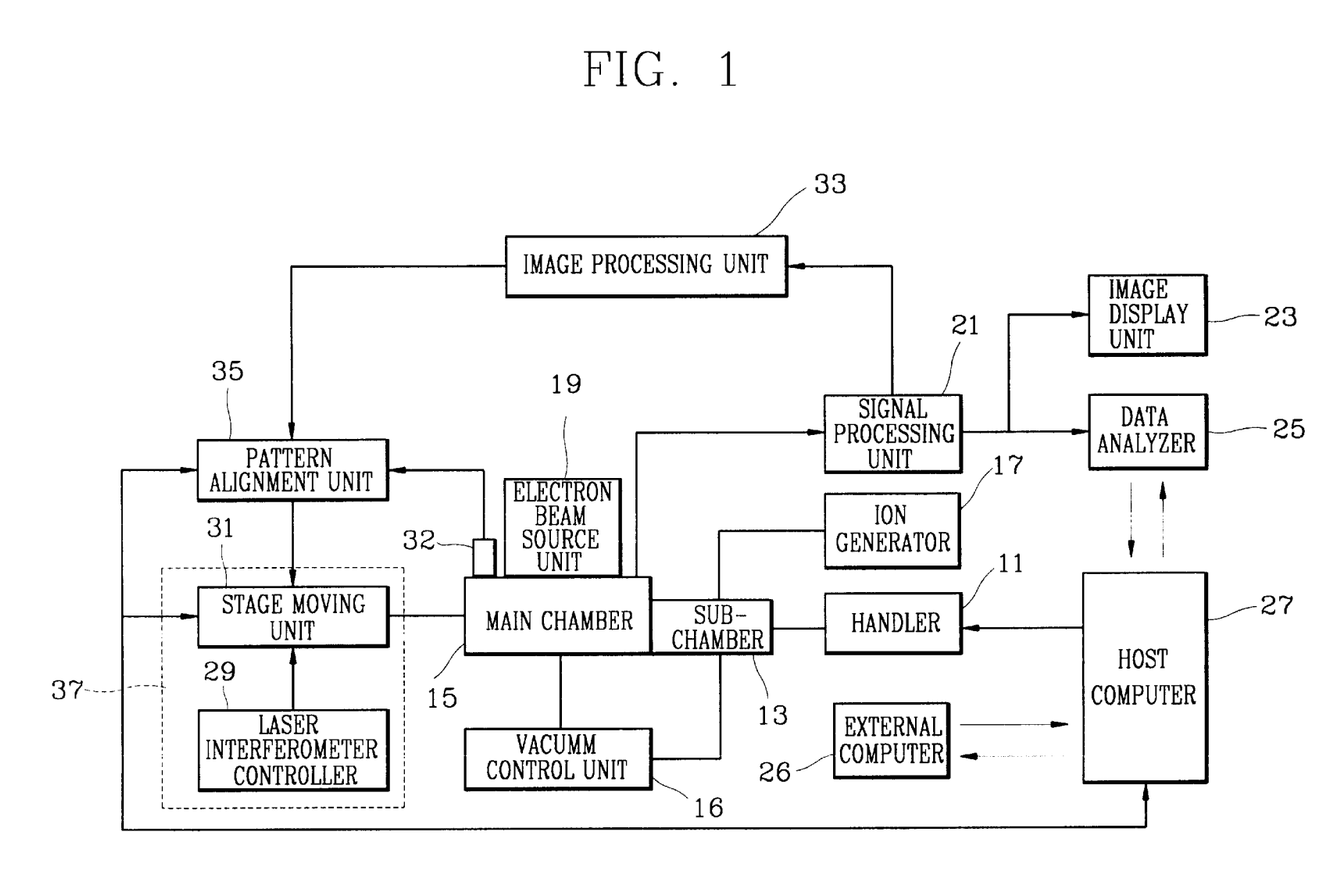
FIG. 1 is a block diagram illustrating an apparatus for detecting defects of a semiconductor device according to embodiments of the present invention.

Referring now to FIG. 1, an apparatus for detecting electrical defects in a semiconductor device according to embodiments of the present invention will now be further described. The apparatus illustrated in FIG. 1 includes a sub-chamber 13 configured to receive a semiconductor substrate (semiconductor wafer) for use in forming a semiconductor device. The illustrated apparatus further includes a handler unit 11 which may be used to load the semiconductor substrate and a main chamber 15 which may include a stage in which the semiconductor substrate is loaded. A vacuum control unit 16 is illustrated which is connected to the main chamber 15 and the sub-chamber 13. The vacuum control unit 16 may be used to control the vacuum state of the chambers. The pattern alignment unit 35 may be used to recognize a pattern image on a semiconductor substrate loaded in the main chamber 15, for example, with the use of an optical means such, as a microscope. The pattern alignment unit 35 may further be configured to align the recognized image to be roughly set by an original image saved in a memory.

Note that the invention is described above with reference to an apparatus which may operate both to detect defects and to form the semiconductor device. However, it is to be understood that the present invention is not so limited and that the apparatus in various embodiments need not include all of the blocks shown in FIG. 1.

To detect electrical defects on a semiconductor substrate which is placed in main chamber 15, the apparatus illustrated in FIG. 1 further includes an electron beam source unit 19 which is connected to the main chamber 15. The electron beam source unit 19 is configured to emit a primary electron beam. The emitted primary electron beam may have a first state to cause accumulation of electrons in the semiconductor substrate, a second state to cause accumulation of holes and a third state that allows detection of secondary electron emissions from the semiconductor substrate. A signal processing unit 21 is configured to detect electrical signals caused by a voltage contrast from secondary electrons released from the semiconductor substrate after the application of the primary electron beam and to amplify the detected signals.

An ion generator 17 is also illustrated coupled to the sub-chamber 13 which is configured to dope positive holes (cations) and/or electrons (anions) on the surface of the semiconductor substrate when the substrate is positioned within the sub-chamber 13. This ion generator 17 may also, similarly to the electron beam source unit 19, be used to detect electrical defects in the semiconductor substrate so that these defects may, for example, be classified by type of defect.

The apparatus illustrated in FIG. 1 further includes an image display unit 23 connected to the signal processing unit 21 which is configured to generate a visual representation of the electrical signals processed by the signal processing unit 21, for example, using image-processing techniques. A data analyzer 25 connected to the signal processing unit 21 is configured to analyze the electrical signals processed by the signal processing unit 21, determine whether electrical defects have occurred and then further process the electrical signals, for example, statistically.

The apparatus illustrated in FIG. 1 further includes a host computer 27 configured to output data concerning the positions of defects on the semiconductor substrate, which may be received from an external computer 26, and to control the stage control unit 37, which includes a laser interferometer controller 29, and the stage moving unit 31, for the purpose of identifying the positions of defects, such as physical defects, on the semiconductor substrate on the basis of the data received, for example, from the external computer 26.

Note that, before the identification of physical defect positions, a datum (reference) point of an alignment mark may be set for the purpose of aligning the semiconductor substrate precisely. To set an alignment mark on the semiconductor substrate based on an alignment mark saved in the host computer 27, the two marks may be compared with each other and then the semiconductor substrate can be adjusted using the stage control unit 37.

The apparatus illustrated in FIG. 1 also includes an image processing unit 33 configured to process the physical defect position data received from the host computer 27 and to feed back the image processed data to the stage control unit 37. The image processing unit 33 also is configured to further process the electrical signals processed by the signal processing unit 21 to convert them into a bright image or a dark image and to feed back the bright or dark image to the host computer 27. Such processing may be based, in part, on an electrical defect classification flow chart maintained by the host computer 27.

While the apparatus illustrated in FIG. 1 includes a number of controller type components for use in detecting defects in a semiconductor device, it is to be understood that the distribution of operations associated with the present invention is not limited to the particular group of components illustrated in FIG. 1. For example, the signal processing unit 21, the data analyzer 25 and the host computer 27 could be combined in a single unit or other groupings of the described capabilities.

Figure 2:
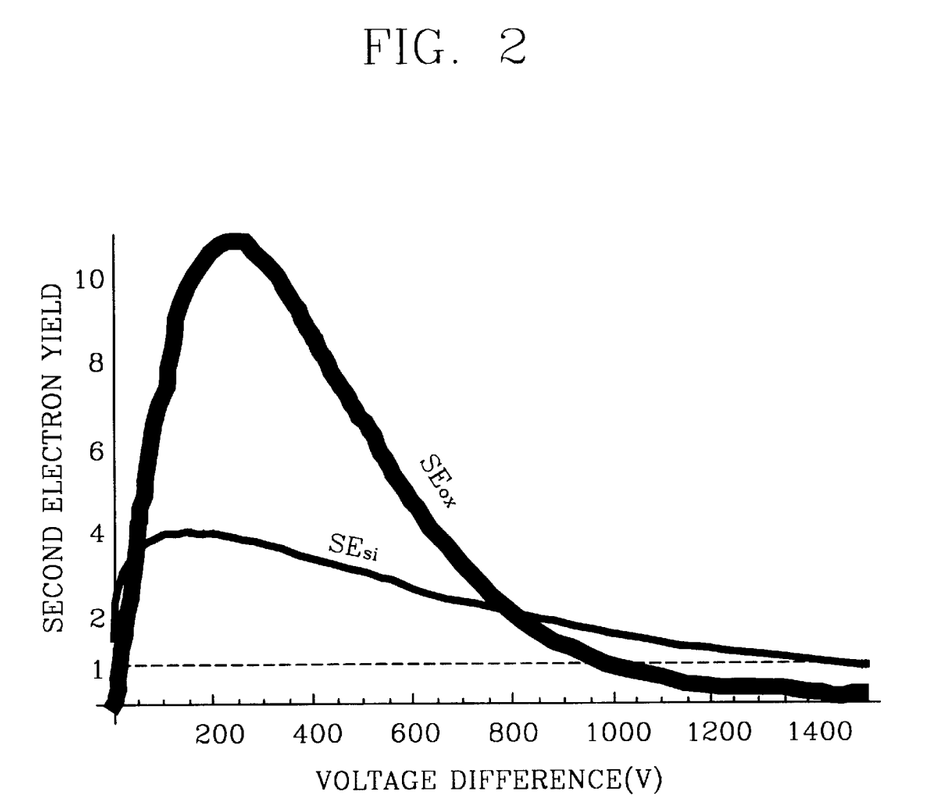
FIG. 2 is a graph illustrating secondary electron yields versus the voltage difference between the surface of a semiconductor substrate and its backside according to embodiments of the present invention.

By way of background to further description of the present invention, secondary electron emission yield will now be further described with reference to FIG. 2. The yields of secondary electrons released from different substances, such as an oxide layer and silicon, will be described. FIG. 2 is a graph illustrating a secondary electron yield which varies with the difference in voltage between the surface (topside) and backside of a semiconductor substrate. In FIG. 2, the x-axis indicates the difference in voltage between the surface and backside of a semiconductor substrate which may be generated by the application of a primary electron beam to the substrate. The y-axis indicates a secondary electron yield which is the ratio of secondary electrons released from the semiconductor substrate with respect to the electrons introduced, for example, by the primary electron beam. In particular, a secondary electron yield for silicon and a secondary electron yield for an oxide layer are indicated by SEsi and SEox, respectively in FIG. 2.

Referring to FIG. 2, if the secondary electron yield does not exceed 1, the number of electrons released from the surface of a semiconductor wafer is less than the number of electrons applied to that surface. Therefore, electrons are accumulated on the surface of the semiconductor substrate, for example, at the surface of conductive pads formed in the semiconductor substrate. In contrast, if the secondary electron yield exceeds 1, the number of electrons released from the surface of a semiconductor wafer is greater than the number of electrons applied to that surface. Accordingly, holes are accumulated on the surface of the semiconductor substrate, for example, at the surface of the conductive pads. In other words, when operating in a voltage difference range where the secondary electron yield is less than 1, excess electrons may be accumulated. When operating in a voltage difference range where the secondary electron yield is greater than 1, excess holes may be accumulated.

The accumulation of electrons or holes on the surface of a semiconductor substrate in accordance with the present invention may be used to detect and/or classify electrical defects, for example, using the apparatus for detecting electrical defects in a semiconductor device of FIG. 1. The electrons or holes may be accumulated on the surface of a semiconductor device using the ion generator 17 and/or the electron beam source unit 19 of the apparatus for detecting electrical defects illustrated in FIG. 1. In FIG. 2, only the distributions of secondary electron yields for silicon and an oxide layer are illustrated. However, it is to be understood that the present invention may also be applied to other materials having an ion or electron generating region and a hole generating region.

Operations related to detecting defects of different types in accordance with various embodiments of the present invention will now be further described with reference to the examples schematically illustrated in FIGS. 3 through 5. The illustrated electrical defect causation types, as will be described below, include a resistance defect which occurs in a non-etched contact portion, a leakage defect caused by a junction leakage source, and a short-circuit between a conductive pad and a conductive line.

Figure 3A:
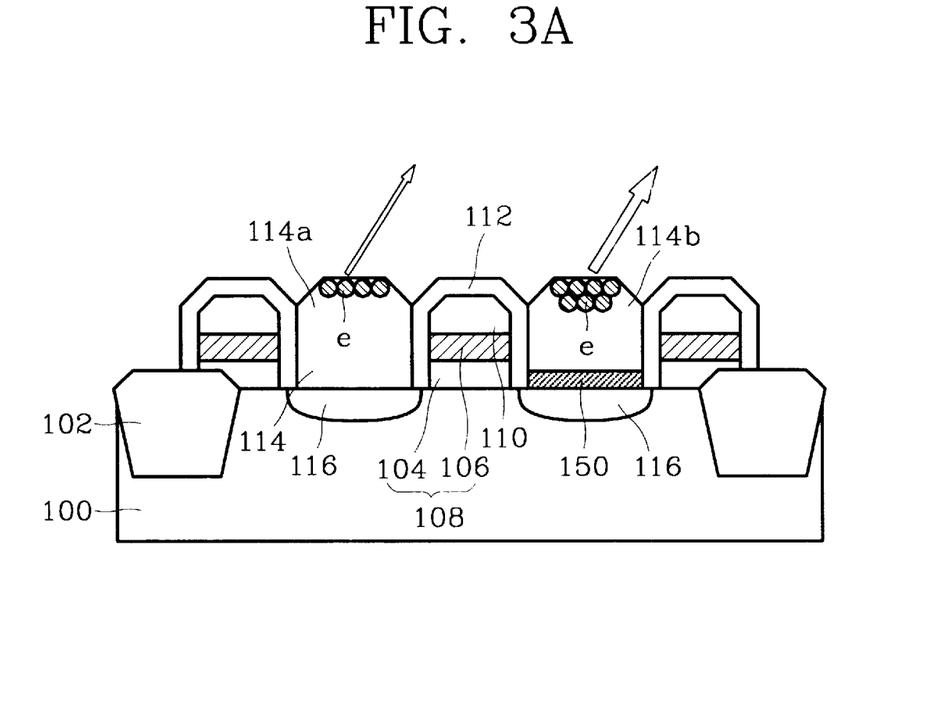
FIG. 3A is a schematic diagram illustrating a defect image from two conductive pads, one of which includes a non-etched contact portion, after accumulating electrons in the conductive pads according to embodiments of the present invention.
Figure 3B:
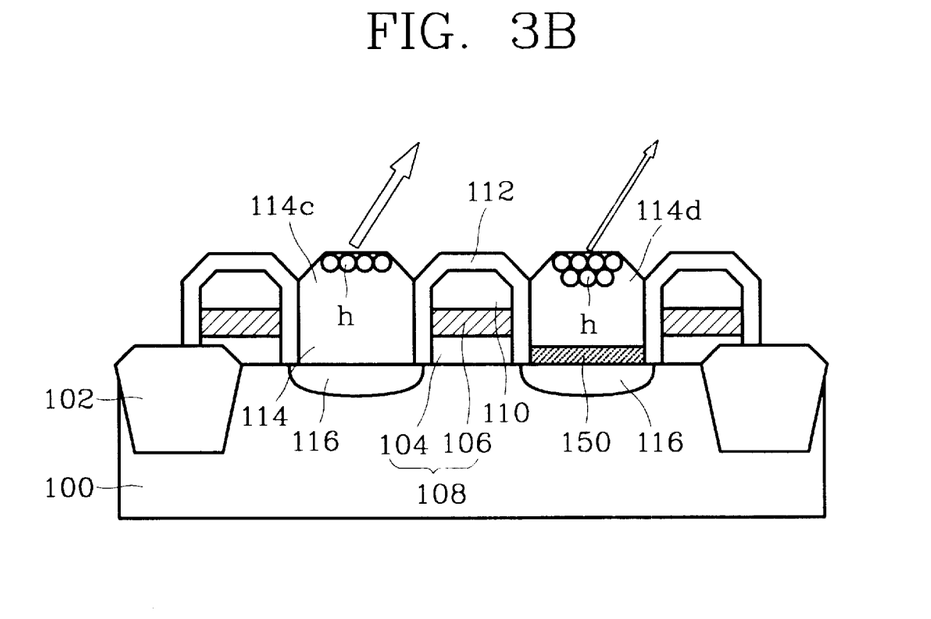
FIG. 3B is a schematic diagram illustrating a defect image from two conductive pads, one of which includes a non-etched contact portion, after accumulating holes in the conductive pads according to embodiments of the present invention.
Figure 4A:
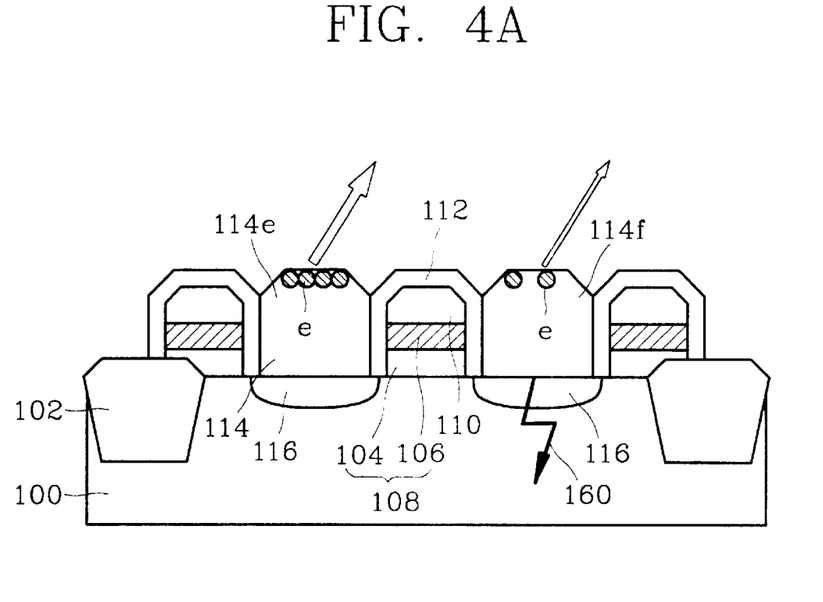
FIG. 4A is a schematic diagram illustrating a defect image from two conductive pads, one of which includes a junction leakage source, after accumulating electrons in the conductive pads according to embodiments of the present invention.
Figure 4B:
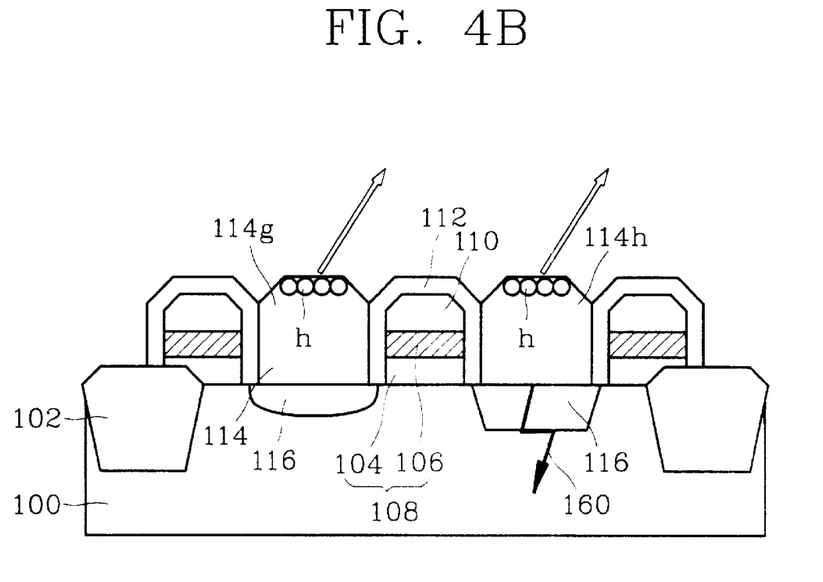
FIG. 4B is a schematic diagram illustrating a defect image from two conductive pads, one of which includes a junction leakage source, after accumulating holes in the conductive pads according to embodiments of the present invention.
Figure 5A:
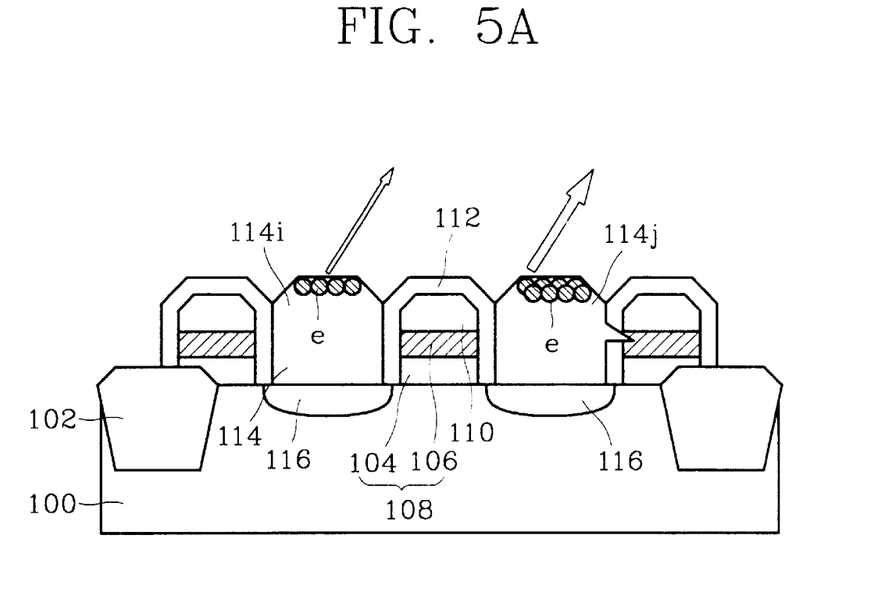
FIG. 5A is a schematic diagram illustrating a defect image from two conductive pads, one of which includes a short circuit to an adjacent conductive line, after accumulating electrons in the conductive pads according to embodiments of the present invention.
Figure 5B:
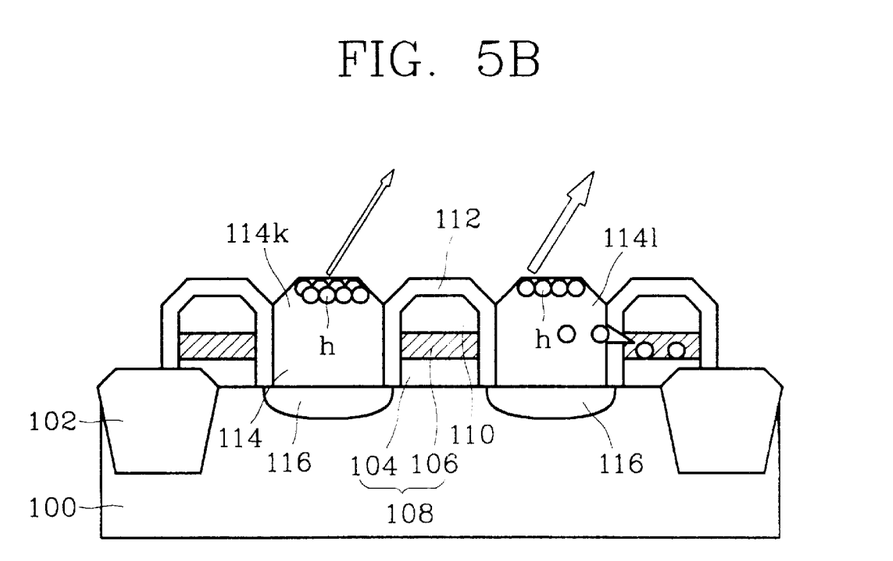
FIG. 5B is a schematic diagram illustrating a defect image from two conductive pads, one of which includes a short circuit to an adjacent conductive line, after accumulating holes in the conductive pads according to embodiments of the present invention.

As shown in FIGS. 3 through 5, the semiconductor device includes a plurality of gate patterns each of which is formed by sequentially accumulating a gate insulating layer (not shown) and a conductive line 108, consisting of a polysilicon layer 104 and a silicide layer 106, such as a tungsten silicide layer, which may act as a gate electrode, and a capping insulating layer 110. Spacers 112, which cover each of the gate patterns, are also formed in the semiconductor device. Between the spacers 112, conductive pads 114, which electrically connect to an impurity region 116, such as source and a drain region, are formed. Each of the conductive pads 114 are formed of a polysilicon layer which has been doped with impurities, a tungsten layer, an aluminum layer or a copper layer. While a gate electrode is used as an example of the conductive lines 108, they may also be bit lines. Furthermore, while a particular structure and materials for the semiconductor device are described and illustrated for purposes of simplifying the explanation of the present invention, it is to be understood that the present invention is not limited solely to this particular structure and/or materials.

FIGS. 3A and 3B are schematic diagrams illustrating a defect image (bright or dark image from secondary electron emission detection) from two conductive pads, one of which includes a non-etched contact portion. As used herein, the term "non-etched contact portion" refers to a region of unetched insulating material between the conductive pad and the semiconductor substrate which may have been left as a result of inadequate etching during the manufacturing process. While only two conductive pads are illustrated to simplify explanation of the present invention, it is to be understood that a greater number of conductive pads will typically be present in a semiconductor device being tested in accordance with embodiments of the present invention.

FIG. 3A illustrates the defect image where the secondary electron yield for the conductive pads 114a and 114b is in a region where electrons, which will subsequently be released as secondary electrons, may accumulate (i.e., with reference to FIG. 2, has been made less than 1) by increasing the difference in voltage between the surface and backside of the semiconductor substrate 100 using a high energy primary beam. In this condition, the number of secondary electrons released from the conductive pads is less than the number of secondary electrons applied to the conductive pads, and consequently, electrons are accumulated on the surface of conductive pads 114a and 114b. Note that, as used herein, "accumulating" electrons (or holes, i.e., a reduced number of electrons in a region) refers to increasing the number of electrons (or holes) available to change the secondary electron emission levels subsequently and it is to be understood that the "accumulated" level in one conductive pad may be the normal electron level for the material of the conductive pad so long as a detectable differential number of electrons are present in another conductive pad so as to provide a detectable voltage contrast as will be further described herein.

As shown in FIG. 3A, more electrons accumulate in the conductive pad 114b having a non-etched contact portion 150 than in the other conductive pad 114a having an open contact portion. The different levels of electron accumulation result from the non-etched contact portion reducing the number of electrons moving to the semiconductor substrate 100 from the conductive pad 114b as compared to the conductive pad 114a.

A primary electron beam may be applied to the surface of the semiconductor substrate 100 including the two conductive pads 114a and 114b to provide the desired voltage difference across the substrate 100 using the electrical defect detection apparatus of FIG. 1. The primary electron beam may also be applied, typically at a different power level which may be determined by experimentation, to measure the secondary electron emissions to provide a voltage contrast reading for use in detecting defects in accordance with embodiments of the present invention. The many electrons (e) remaining in the non-etched contact portion 150 provide the non-etched contact portion a greater repulsive force than the open contact portion. Accordingly, the conductive pad 114b having the non-etched contact portion 150 releases more second electrons than the conductive pad 114a having the open contact portion. Consequently, the conductive pad 114b may be associated with a bright image based on the detected level of secondary electron emissions.

FIG. 3B illustrates the defect image where the secondary electron yield in the conductive pads is in a region where holes may accumulate (i.e., with reference to FIG. 2, has been made more than 1) by decreasing the difference in voltage between the surface and backside of the semiconductor substrate 100 using a low energy primary beam to provide for accumulation of holes. In this condition, the number of secondary electrons released from the conductive pads is greater than the number of second electrons applied to the conductive pads, and, consequently, holes (h) are accumulated on the surface of the conductive pads 114c and 114e. As shown in FIG. 3B, more holes remain in the conductive pad 114d having a non-etched contact portion than in the other conductive pad 114c having an open contact portion. The difference in accumulation of holes results from the non-etched contact portion preventing more holes from moving to the semiconductor substrate 100 than the open contact portion.

As described with reference to FIG. 3A, a primary electron beam may be applied to the surface of the semiconductor substrate 100 including the two conductive pads 114c and 114d, for example, using the electrical defect detection apparatus of FIG. 1, to detect secondary electron emission levels of the conductive pads 114c and 114d. The holes remaining on the surface of the conductive pads 114c and 114d act as a trap for secondary electrons which would otherwise be released. Because of the different quantity of accumulated holes in the conductive pads 114c and 114d, the conductive pad 114d having the non-etched contact portion 150 releases less secondary electrons than the conductive pad 114c having the open contact portion. Consequently, the conductive pad 114d having the non-etched contact portion 150 may be associated with a dark image based on the level of detected secondary electron emissions.

FIGS. 4A and 4B are schematic diagrams illustrating a defect image from two conductive pads, one of which includes a junction leakage source. More particularly, FIG. 4A illustrates the defect image where the secondary electron yield has been made less than 1 by increasing the difference in voltage between the surface and backside of the semiconductor substrate 100. In this condition, as described with reference to FIG. 3A, electrons are accumulated on the surface of conductive pads 114e and 114f. However, for the conductive pad 114f having a leakage source portion 160, less electrons (e) are accumulated than in the other conductive pad 114e because some electrons remaining in the conductive pad 114f leak out to the leakage source portion 160.

As described above, a primary electron beam may be applied to the surface of the semiconductor substrate 100 including the conductive pads 114e and 114f, for example, using the electrical defect detection apparatus, to detect secondary electron emission levels of the conductive pads 114e and 114f. If the semiconductor substrate 100 is of the P-type and has a N-type junction area, as shown in FIG. 4A, the number of secondary electrons released from the conductive pad 114f having the leakage source portion 160 is reduced due to the leakage of electrons through the leakage source portion 160. Consequently, the conductive pad 114f may be associated with a dark image based on the level of detected secondary electron emissions.

If the semiconductor substrate 100 is of the N-type and has a P-type junction area, the substrate may become reverse biased and the surface charge of each of the conductive pads 114e and 114f may not be changed. Consequently, the conductive pad 114f having the leakage portion 160 and the other conductive pad 114g may not be different from each other in their images.

FIG. 4B illustrates the defect image where the secondary electron yield has made more than 1 and holes (h) are accumulated on the surface of conductive pads 114g and 114h. A primary electron beam may then be applied to the surface of the semiconductor substrate 100 including the conductive pads 114g and 114h, for example, using the electrical defect detection apparatus shown in FIG. 1, to detect secondary electron emissions of the conductive pads 114g and 114h.

If, as illustrated in FIG. 4B, the semiconductor substrate 100 is of the P-type and has a N-type junction area, the substrate may become reverse biased and the surface charge of each of the conductive pads 114g and 114h may not be changed. Consequently, the conductive pad 114h having the leakage source portion 160 and the other conductive pad 114g may not be different from each other in their defect images. On the other hand, if the semiconductor substrate 100 is of the N-type and has a P-type junction area, the substrate 100 becomes forward biased. Accordingly, the conductive pad 114h having the leakage source portion 160 may be associated with a bright image based on leakage of holes through the leakage source portion 160 allowing a greater level of secondary electron emissions from conductive pad 114h than from conductive pad 114g.

FIGS. 5A and 5B are schematic diagrams illustrating a defect image from two conductive pads, one of which includes a short-circuit between a conductive pad and a conductive line using the detection apparatus of FIG. 1. FIG. 5A illustrates the defect image where the secondary electron yield has been made less than 1 and electrons (e) are accumulated on the surface of conductive pads 114i and 114j. As described above, a primary electron beam may then be applied to the surface of the semiconductor substrate 100 including the conductive pads 114i and 114j, for example, using the electrical defect detection apparatus of FIG. 1, to detect secondary electron emission levels.

If there is a short-circuit between the conductive pad 114j and a conductive line 108 having electrons, for example, as shown in FIG. 5A where a silicide layer 106 exists, electrons cannot leak out to the conductive line 108 and consequently many electrons remain at the surface of the conductive pad 114j. Therefore, when a primary electron beam is applied to detect secondary electron emission levels, the amount of secondary electrons releasing from the conductive pad 114j is higher and may be associated with a bright image.

FIG. 5B illustrates the defect image where the secondary electron yield has been made less than 1 and holes (h) are accumulated on the surface of conductive pads 114k and 114l. As described above, a primary electron beam may then be applied to the surface of the semiconductor substrate 100 including the conductive pads 114k and 114l to detect secondary electron emission levels. For the conductive pad 114l having a short-circuit with a conductive line 108 having electrons, such as the silicide layer 106 illustrated in FIG. 5B, holes (h) leak out to the conductive line 108, so that less holes remain at the surface of the conductive pad 114l than at the other conductive pad 114k. Therefore, the amount of secondary electrons released from the conductive pad 114l increases relatively so that the conductive pad 114l may be associated with a bright image.

As illustrated in FIGS. 3 through 5, electrical defects in a semiconductor device can be detected by detecting a voltage contrast caused by secondary electrons released from the surface of conductive pads and converting the contrast into a bright image or a dark image associated with a conductive pad. In FIGS. 3 through 5, conductive pads are compared with each other to determine whether an image associated with the conductive pads is dark or bright. However, it is to be understood that the determination of whether a conductive pad should be associated with a bright or dark image may also be based on a standard value determined in advance, for example, experimentally.

Furthermore, FIGS. 3 through 5 have been generally described with reference to the electrons and/or holes being accumulated on the surface of conductive pads 114a through 114l by adjusting the energy of a primary electron beam. However, the conductive pad can also be doped directly using an ion generator, such as the ion generator 17 of FIG. 1.

Different electrical defect types have been illustrated in the figures including a resistance type defect non-etched contact portion, and a leakage electrical defect as illustrated by a short-circuit between the conductive pad 114j and the conductive line 108. These particular defects may result in similar brightness levels of the detected defect image, when accumulating electrons on the surface of the conductive pads 114b and 114j. However, it may be desirable to classify and identify which kind of electrical defects have occurred. Such classification and identification may be desirable for improving the manufacture process by reducing or preventing the occurrence of various defects by corrective action in the manufacture process.

Various methods of detecting defects, which may further allow for classification of the type of defects, will now be described with reference to the flowchart illustrations of embodiments of the present invention in FIGS. 6 and 7. The description of FIGS. 6 and 7 will be provided with reference to the semiconductor device illustrated in FIGS. 3 through 5 which includes a semiconductor substrate 100, a plurality of conductive lines 108, insulating layers 110 and 112 and conductive pads 114a through 114l formed between each of the insulating layers.

Figure 6:
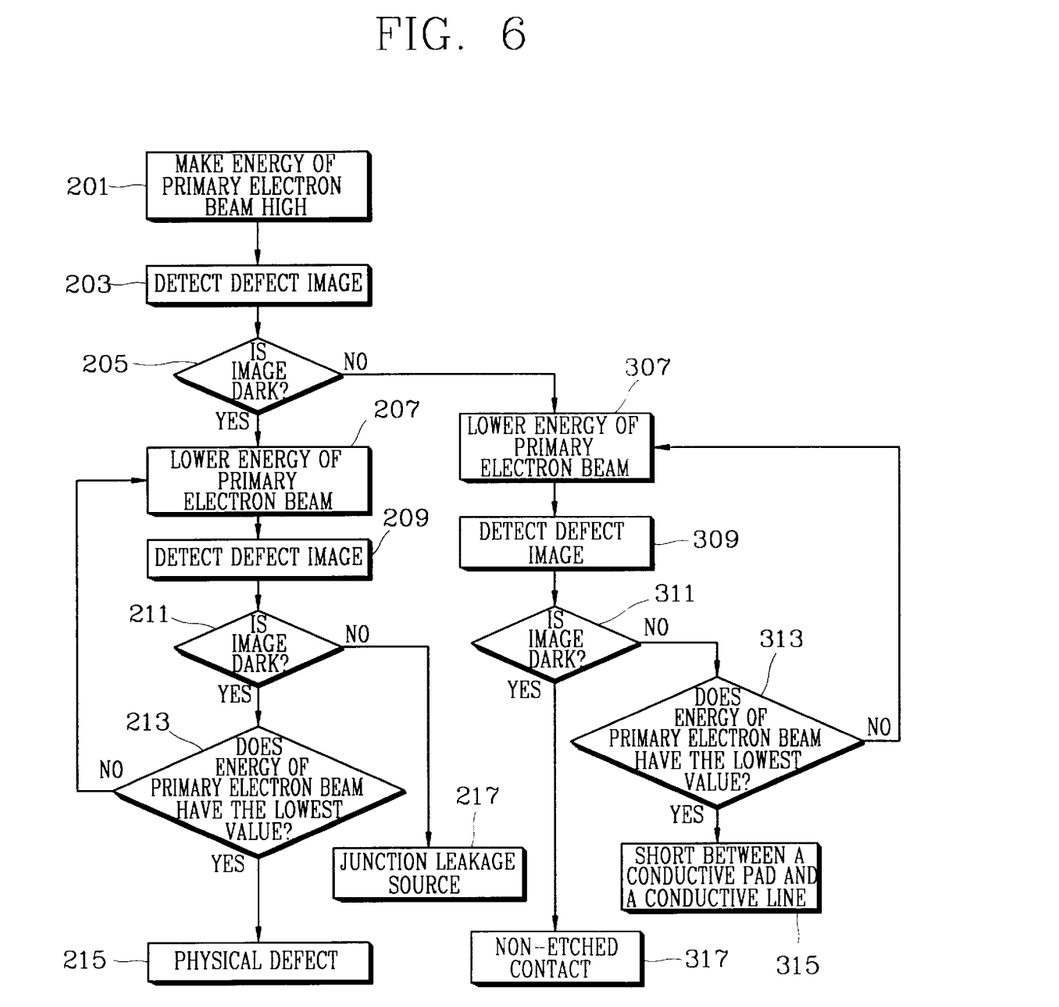
FIG. 6 is a flowchart illustrating operations for detecting electrical defects in a semiconductor device according to embodiments of the present invention.

FIG. 6 is a flowchart illustrating an example of methods for detecting and classifying electrical defects in a semiconductor device, for example, using the apparatus for detecting electrical defects in a semiconductor device illustrated in FIG. 1.

Operations begin at block 201 by making a secondary electron yield less than 1, for example, by making the energy of a primary electron beam high, and electrons are accumulated on the surface of conductive pads. A primary electron beam is applied to the conductive pads at a detection level and secondary electrons released from the surface of the conductive pads are detected (block 203). Thus, a first voltage contrast between the conductive pads may be detected and a first defect image is obtained from the first voltage contrast (block 203). It is determined if the first defect image is a dark image or a bright image (block 205).

If the first defect image is a dark image (block 205), holes are accumulated on the surface of the conductive pads, for example, by adjusting the energy of a primary electron beam to a low level (block 207). A primary electron beam is applied to the conductive pads and secondary electrons released from the surface of the conductive pads are detected (block 209). Thus, a second voltage contrast between the conductive pads may be detected and a second defect image is obtained from the second voltage contrast (block 209). It is determined if the second defect image is a dark image or a bright image (block 211).

If the second defect image is a dark image (block 209), and the energy of a primary electron beam has a lowest value (block 213), the conductive pad having the dark defect image is determined to have a physical defect (block 215). However, as illustrated for the embodiments of FIG. 6, if the defect image is a dark image but the energy of a primary electron beam is not the lowest value, operations return to block 207 and continue as described above but with the energy level of the primary beam reduced on successive iterations until the lowest value for the primary beam is reached. If the second defect image is not a dark image (block 211), the conductive pad is classified as having a defect image caused by a junction leakage source (block 217).

If the first defect image is not a dark image (block 205), the energy of a primary electron beam is lowered and holes are accumulated on the surface of conductive pads (block 307). A primary electron beam is applied to the conductive pads at a test level and secondary electrons released from the surface of the conductive pads are detected (block 309). Accordingly, a voltage contrast between the conductive pads may be detected and a second defect image (which may alternatively be referred to herein as a thirdly detected defect image) is obtained from the voltage contrast (block 309). It is determined if the second defect image is a dark image (block 311). If the second defect image is a dark image (block 311), the conductive pad is determined to have an electrical defect caused by a non-etched contact portion (block 317). If the second defect image is not a dark image (block 311), it is determined if the energy of a primary electron beam has the lowest value or not (block 313). If the energy of a primary electron beam has the lowest value (block 313), the conductive pad which does not have a dark image is classified as having an electrical defect caused by a short-circuit between a contact portion and a conductive line (block 315). If the energy value of the primary beam is not yet at the lowest level, operations return to block 307 and repeat as described above with the energy level of the primary beam reduced in each (of one or more additional) iteration until the lowest level is obtained.

To summarize the defect detection and classification operations illustrated in FIG. 6, when electrical defects in a semiconductor device are detected using an apparatus for detecting electrical defects after electrons are accumulated on the surface of conductive pads of the semiconductor device, the conductive pad having a dark image may indicate that physical defects or electrical defects caused by junction leakage are present in the semiconductor device. After holes are accumulated on the surface, the defect image of the conductive pads having a junction leakage is reversed while the defect image of the conductive pad having physical defects is not reversed.

When electrons are accumulated on the surface of conductive pads and the conductive pads have a defect image which is not dark, this indicates electrical defects caused by a short-circuit between a contact portion and a conductive line or a non-etched contact portion may be present. After holes are accumulated on the surface, the defect image of the conductive pad having a non-etched contact portion is reversed, while the defect image of the conductive pad including a short-circuit between a contact portion and a line is not reversed.

Figure 7:
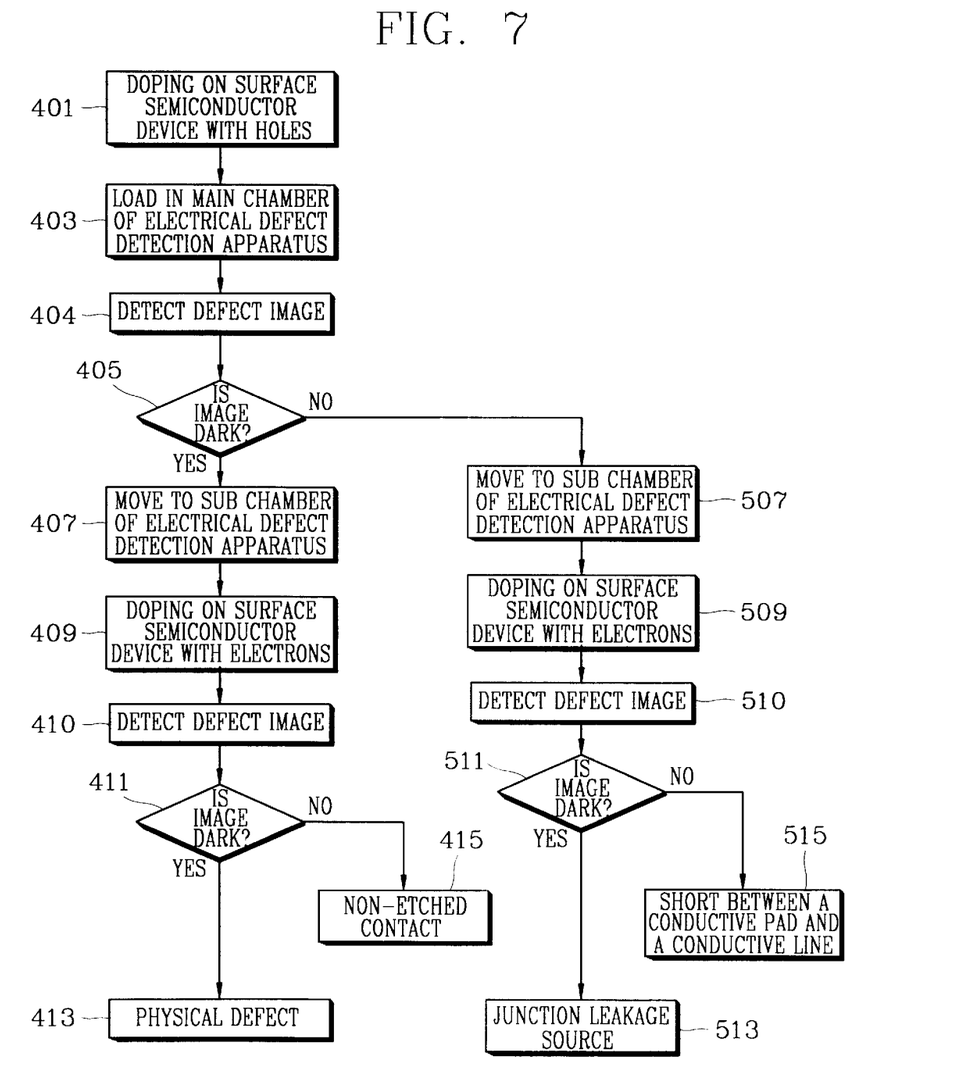
FIG. 7 is a flowchart illustrating operations for detecting electrical defects in a semiconductor device according to other embodiments of the present invention.

FIG. 7 is a flowchart illustrating further embodiments of operations for detecting and classifying electrical defects of a semiconductor device, for example, using the apparatus for detecting electrical defects in a semiconductor device of FIG. 1, according to the present invention. In general, FIG. 7 differs from operations as shown in FIG. 6 in that the hole accumulation condition precedes the electron accumulation condition. FIG. 7 will also be described with reference to embodiments in which the ion generator 17 is used. While operations will be described with reference to the particular apparatus of FIG. 1, it is to be understood that the present invention is not so limited.

Operations begin by accumulating holes on the surface of conductive pads of a semiconductor device loaded in the sub-chamber 13 of FIG. 1, using the ion generator 17 (block 401). The semiconductor device is loaded into the main chamber 15 (block 403) and a primary electron beam is applied at a test level to the conductive pads accumulated with holes and secondary electrons released from the surface of the conductive pads are detected (block 404). Accordingly, a voltage contrast between the conductive pads may exist and a first defect image is obtained from the voltage contrast (block 404). It is determined whether the first defect image is a dark image or not (block 405).

If the first defect image is a dark image (block 405), the semiconductor device is unloaded from the main chamber 15 and loaded into the sub-chamber 13 (block 407). Electrons are accumulated on the surface of conductive pads of this semiconductor device using ion generator 17 (block 409). A primary electron beam is applied at a test level to the conductive pads accumulated with electrons and secondary electrons released from the surface of the conductive pads are detected (block 410). Accordingly, a voltage contrast between the conductive pads may exist and a second defect image is obtained from the voltage contrast (block 410). It is determined whether the second defect image is a dark image or not (block 411). If the second defect image is dark (block 411), the conductive pad having the dark defect image is classified as having a physical defect (block 413). If the second defect image is not a dark image (block 411), the conductive pad is classified as having an electrical defect caused by a non-etched contact portion (block 415).

If the first defect image is not a dark image (block 405), the semiconductor device is also unloaded from the main chamber 15 and loaded into the sub-chamber 13 (block 507). Electrons are accumulated on the surface of conductive pads of the semiconductor device using the ion generator 17 (block 509). A primary electron beam is applied to the conductive pads accumulated with electrons and secondary electrons released from the surface of the conductive pads are detected (block 510). Accordingly, a voltage contrast between each of the conductive pads may exist and a second defect image (which may alternatively be referred to herein as a thirdly detected defect image) is obtained from the voltage contrast (block 510). It is determined if the second defect image is a dark image or not (block 511). If the second defect image is a dark image (block 511), the conductive pad having this dark image is classified as having an electrical defect caused by a junction leakage source (block 513). If the second defect image is not dark (block 511), the conductive pad is classified as having an electrical defect caused by a short-circuit between a contact portion and a conductive line (block 5150.

To summarize the operations described with reference to FIG. 7, when electrical defects in a semiconductor device are detected after holes are accumulated on the surface of conductive pads of the semiconductor device, a conductive pad exhibiting a dark defect image indicates that physical defects or electrical defects caused by a non-etched contact portion exist in the semiconductor device. After electrons are accumulated on the surface charge, the defect image of the conductive pad having a non-etched contact portion is reversed while the defect image of the conductive pad having physical defects is not reversed. When the conductive pads do not have a dark image (bright image) after holes are accumulated on the surface of conductive pads, this indicates that electrical defects caused by junction leakage or a short-circuit between a contact portion and a conductive line exist. However, after electrons are accumulated on the surface, the defect image of the conductive pad including a short-circuit between a contact portion and a conductive line is not reversed, while the defect image of the conductive pad having a junction leakage source is reversed.

In the drawings and specification, there have been disclosed typical illustrative embodiments of the invention and, although specific terms are employed, they are used in a generic and descriptive sense only and not for purposes of limitation, the scope of the invention being set forth in the following claims.

That which is claimed is:

1. A method for detecting defects in a semiconductor device including a plurality of conductive pads, the method comprising:
    accumulating electrons in ones of the plurality of conductive pads;
    detecting a first contrast between the ones of the plurality of conductive pads based on secondary electron emissions from the ones of the plurality of conductive pads after electrons are accumulated in the ones of the plurality of conductive pads;
    accumulating holes in the ones of the plurality of conductive pads;
    detecting a second contrast between the ones of the plurality of conductive pads based on secondary electron emissions from the ones of the plurality of conductive pads after holes are accumulated in the ones of the plurality of conductive pads; and
    determining whether a defect is present in one of the conductive pads based on the first contrast and the second contrast.

2. The method of claim 1 wherein the detecting steps further comprise applying a primary electron beam to the ones of the plurality of conductive pads.

3. The method of claim 1 wherein the accumulating electrons step comprises accumulating electrons on a surface of the ones of the plurality of conductive pads and wherein the accumulating holes step comprises accumulating holes on a surface of the ones of the plurality of conductive pads.

4. The method of claim 1 wherein the accumulating electrons step further comprises accumulating the electrons by adjusting the energy of a primary electron beam applied to the ones of the plurality of contact pads and wherein the accumulating holes step further comprises accumulating the holes by adjusting the energy of a primary electron beam applied to the ones of the plurality of conductive pads.

5. The method of claim 4 wherein the detecting steps further comprise applying a primary electron beam to the ones of the plurality of conductive pads.

6. The method of claim 1 wherein the accumulating electrons step further comprises accumulating the electrons using an ion generator and wherein the accumulating holes step further comprises accumulating the holes using the ion generator.

7. The method of claim 1 wherein the step of detecting a first contrast further comprises the step of detecting a first voltage contrast associated with the one of the conductive pads and wherein the step of detecting a second contrast further comprises the step of detecting a second voltage contrast associated with the one of the conductive pads.

8. The method of claim 7 wherein the step of detecting a first contrast further comprises the step of associating either a first bright image or a first dark image with the one of the conductive pads based on the detected first voltage contrast and wherein the step of detecting a second contrast further comprises the step of associating either a second bright image or a second dark image with the one of the conductive pads based on the detected second voltage contrast.

9. The method of claim 8 wherein the step of determining whether defects are present in the one of the conductive pads based on the first contrast and the second contrast further comprises at least one of:
    determining that an electrical defect caused by a junction leakage source is present in the one of the conductive pads when the one of the conductive pads is associated with a first dark image and a second bright image;
    determining that an electrical defect caused by a non-etched contact portion between the one of the contact pads and a semiconductor substrate of the semiconductor device is present in the one of the conductive pads when the one of the conductive pads is associated with a first bright image and a second dark image;
    determining that an electrical defect caused by a short-circuit between the one of the conductive pads and an adjacent conductive line of the semiconductor device is present in the one of the conductive pads when the one of the conductive pads is associated with a first bright image and a second bright image; and
    determining that a physical defect is present in the one of the conductive pads when the one of the conductive pads is associated with a first dark image and a second dark image.

10. The method of claim 7 wherein the step of determining a first voltage contrast associated with the one of the conductive pads further comprises the step of determining the first voltage contrast based on a standard value and wherein the step of detecting a second voltage contrast associated with the one of the conductive pads further comprises the step of determining the second voltage contrast based on a standard value.

11. The method of claim 7 wherein the step of determining a first voltage contrast associated with the one of the conductive pads further comprises the step of determining the first voltage contrast based on a comparison of secondary electron emissions from the one of the conductive pads and secondary electron emissions from at least one other one of ones of the plurality of conductive pads and wherein the step of detecting a second voltage contrast associated with the one of the conductive pads further comprises the step of determining the second voltage contrast based on a comparison of secondary electron emissions from the one of the conductive pads and secondary electron emissions from at least one other one of ones of the plurality of conductive pads.

12. The method of claim 1 wherein the step of detecting a first contrast precedes the step of detecting a second contrast.

13. The method of claim 1 wherein the step of detecting a second contrast precedes the step of detecting a first contrast.

14. The method of claim 1 wherein the step of accumulating electrons in ones of the conductive pads further comprises generating a voltage difference between a surface of the semiconductor device and a backside of the semiconductor device selected to provide an accumulation of electrons in the ones of the conductive pads.

15. The method of claim 14 wherein the step of accumulating holes in ones of the conductive pads further comprises generating a voltage difference between a surface of the semiconductor device and a backside of the semiconductor device selected to provide an accumulation of holes in the ones of the conductive pads.

16. The method of claim 15 wherein the voltage difference is generated by adjusting the energy of a primary electron beam applied to the ones of the plurality of conductive pads.

17. An apparatus for detecting defects in a semiconductor device including a plurality of conductive pads, the apparatus comprising:

means for accumulating electrons in ones of the plurality of conductive pads;

means for detecting a first contrast between the ones of the plurality of conductive pads based on secondary electron emissions from the ones of the plurality of conductive pads after electrons are accumulated in the ones of the plurality of conductive pads;

means for accumulating holes in the ones of the plurality of conductive pads;

means for detecting a second contrast between the ones of the plurality of conductive pads based on secondary electron emissions from the ones of the plurality of conductive pads after holes are accumulated in the ones of the plurality of conductive pads; and means for determining whether a defect is present in one of the conductive pads based on the first contrast and the second contrast.

18. The apparatus of claim 17 wherein the means for detecting a first contrast further comprises means for associating either a first bright image or a first dark image with the one of the conductive pads based on a detected first voltage contrast and wherein the means for detecting a second contrast further comprises means for associating either a second bright image or a second dark image with the one of the conductive pads based on a detected second voltage contrast and wherein the means for determining whether defects are present in the one of the conductive pads based on the first contrast and the second contrast further comprises at least one of:

means for determining that an electrical defect caused by a junction leakage source is present in the one of the conductive pads when the one of the conductive pads is associated with a first dark image and a second bright image;

means for determining that an electrical defect caused by a non-etched contact portion between the one of the contact pads and a semiconductor substrate of the semiconductor device is present in the one of the conductive pads when the one of the conductive pads is associated with a first bright image and a second dark image;

means for determining that an electrical defect caused by a short-circuit between the one of the conductive pads and an adjacent conductive line of the semiconductor device is present in the one of the conductive pads when the one of the conductive pads is associated with a first bright image and a second bright image; and means for determining that a physical defect is present in the one of the conductive pads when the one of the conductive pads is associated with a first dark image and a second dark image.

19. An apparatus for detecting defects in a semiconductor device including a plurality of conductive pads, the apparatus comprising:

an electron beam source configured to apply a primary electron beam to the semiconductor device having a first state which causes accumulation of electrons in ones of the plurality of conductive pads, a second state which causes accumulation of holes in the ones of the conductive pads, and a third state that allows detection of secondary electron emissions from the ones of the plurality of conductive pads; and a data analyzer configured to detect a first contrast between the ones of the plurality of conductive pads based on secondary electron emissions from the ones of the plurality of conductive pads after electrons are accumulated in the ones of the plurality of conductive pads and to detect a second contrast between the ones of the plurality of conductive pads based on secondary electron emissions from the ones of the plurality of conductive pads after holes are accumulated in the ones of the plurality of conductive pads and to determine whether a defect is present in one of the conductive pads based on the first contrast and the second contrast.

20. The apparatus of claim 19 further comprising a stage control unit configured to detect positions on the semiconductor device of defects determined to be present.

21. An apparatus for detecting electrical defects in a semiconductor device comprising:

a sub-chamber in which a semiconductor substrate is loaded;

an ion generator which can dope the surface of the semiconductor substrate with holes (cations) or electrons (anions);

a main chamber which is connected to the sub-chamber and includes a stage on which the semiconductor substrate is loaded;

an electron beam source unit which can apply a primary electron beam to a semiconductor substrate placed in the main chamber, in order to detect electrical defects;

a signal processing unit which can detect electrical signals made by the voltage contrast of second electrons released from the semiconductor substrate after the application of the primary electron beam and then amplify the signals;

a data analyzer which can analyze the electrical signals processed by the signal processing unit, determine whether electrical defects have occurred and then process the electrical signals statistically;

a host computer which can output data concerning the positions of physical defects on the semiconductor substrate, received from an external computer and control all components;

a stage control unit which can identify the positions of physical defects on the semiconductor substrate received from the host computer;

an image processing unit which can convert the electrical signals processed by the signal processing unit into an image and feed back the image processed electrical signals to the host computer following a flowchart concerning the classification of electrical defects.

22. The apparatus for detecting electrical defects in a semiconductor device of claim 21, wherein the stage control unit includes a stage moving unit which can move the stage within the main chamber, and a laser interferometer controller which is connected to the stage moving unit.

23. The apparatus for detecting electrical defects in a semiconductor device of claim 21, wherein the signal processing unit is connected to an image display unit which can visualize the electrical signals processed by the signal processing unit by image processing.

24. A method for detecting electrical defects in a semiconductor device comprising the steps of:

preparing a semiconductor device including a plurality of conductive lines, insulating layers for insulating the conductive lines, conductive pads between each of the insulating layers on a semiconductor substrate;

accumulating electrons or holes on the surface of the conductive pads;

applying a primary electron beam to the conductive pads;

determining electrical defects by detecting the voltage contrast between the conductive pads which is caused by the release of second electrons from the conductive pads after the application of a primary electron beam.

25. The method for detecting electrical defects in a semiconductor device of claim 24, wherein the step of accumulating electrons or holes on the surface of the conductive pads is performed using an ion generator.

26. The method for detecting electrical defects in a semiconductor device of claim 24, wherein the step of accumulating electrons or holes on the surface of the conductive pads is performed by adjusting the energy of a primary electron beam.

27. The method for detecting electrical defects in a semiconductor device of claim 24, wherein the step of determining electrical defects is performed by converting the voltage contrast into a bright image or a dark image.

28. A method for detecting electrical defects in a semiconductor device comprising the steps of:

preparing a semiconductor device including a plurality of conductive lines, insulating layers for insulating the conductive lines, conductive pads formed between each of the insulating layers on a semiconductor substrate;

accumulating electrons on the surface of the conductive pads;

firstly detecting a defect image obtained from the voltage contrast between the conductive pads which is caused by the release of second electrons from the conductive pads after the application of a primary electron beam to the conductive pads having accumulated electrons;

determining whether the defect image is a dark image or not;

accumulating holes on the surface of the conductive pads if the firstly detected defect image is a dark image;

secondly detecting a defect image obtained from the voltage contrast between the conductive pads which is caused by the release of second electrons from the conductive pads after the application of a primary electron beam to the conductive pads having accumulated holes;

determining that the conductive pad whose secondly detected defect image is a dark image have physical defects and the conductive pad whose defect image is not a dark image have electrical defects caused by junction leakage source;

accumulating holes on the surface of the conductive pads, if the firstly detected defect image is not a dark image;

thirdly detecting a defect image obtained from the voltage contrast between the conductive pads which is caused by the release of second electrons from the conductive pads after the application of a primary electron beam to the conductive pads having accumulated holes;

determining that the conductive pad whose thirdly detected defect image is a dark image have electrical defects caused by a non-etched contact portion and the conductive pad whose defect image is not a dark image have electrical defects caused by short-circuit between the conductive pad and a conductive line.

29. The method for detecting electrical defects in a semiconductor device of claim 28, wherein the step of accumulating electrons or holes on the surface of the conductive pads is performed by adjusting the energy of a primary electron beam.

30. A method for detecting electrical defects in a semiconductor device comprising the steps of:

preparing a semiconductor device including a plurality of conductive lines, insulating layers for insulating the conductive lines, conductive pads formed between each of the insulating layers on a semiconductor substrate;

accumulating holes on the surface of the conductive pads;

firstly detecting a defect image obtained from the voltage contrast between the conductive pads which is caused by the release of second electrons from the conductive pads after the application of a primary electron beam to the conductive pads having accumulated holes;

determining whether the defect image is a dark image or not;

accumulating electrons on the surface of the conductive pads if the firstly detected defect image is a dark image;

secondly detecting a defect image obtained from the voltage contrast between the conductive pads which is caused by the release of second electrons from the conductive pads after the application of a primary electron beam to the conductive pads accumulated with electrons;

determining that the conductive pad whose secondly detected defect image is a dark image have physical defects and the conductive pad whose defect image is not a dark image have electrical defects caused by a non-etched contact portion;

accumulating electrons on the surface of the conductive pads, if the firstly detected defect image is not a dark image;

thirdly detecting a defect image obtained from the voltage contrast between the conductive pads which is caused by the release of second electrons from the conductive pads after the application of a primary electron beam to the conductive pads accumulated with electrons;

determining that the conductive pad whose thirdly detected defect image is a dark image have electrical defects caused by junction leakage source and the conductive pad whose defect image is not a dark image have electrical defects caused by short-circuit between the conductive pad and a conductive line.

31. The method for detecting electrical defects in a semiconductor device of claim 30, the step of accumulating electrons or holes on the surface of the conductive pads is performed with use of an ion generator.

* * * * *